United States Patent [19]

King et al.

[11] 4,242,149
[45] Dec. 30, 1980

[54] METHOD OF MAKING PHOTODETECTORS USING ION IMPLANTATION AND LASER ANNEALING

[75] Inventors: Gerard J. King, Alexandria; Aubrey J. Dunn, Springfield, both of Va.

[73] Assignee: The United States of America as represented by the Secretary of the Army, Washington, D.C.

[21] Appl. No.: 62,593

[22] Filed: Jul. 31, 1979

[51] Int. Cl.³ .................. H01L 21/26; H01L 21/268; B23K 26/00
[52] U.S. Cl. .................... 148/1.5; 148/175; 357/30; 357/61; 357/91
[58] Field of Search ............... 148/1.5, 175; 357/30, 357/61, 91

[56] References Cited

U.S. PATENT DOCUMENTS

| 4,081,653 | 3/1978 | Koo et al. | 219/121 L |
| 4,147,563 | 4/1979 | Narayan et al. | 148/1.5 |
| 4,154,625 | 5/1979 | Golovchenko et al. | 148/1.5 |
| 4,155,779 | 5/1979 | Auston et al. | 148/1.5 |

FOREIGN PATENT DOCUMENTS 2208271 8/1973 Fed. Rep. of Germany ............ 427/53

OTHER PUBLICATIONS

Marine et al., Appl. Phys. Letts. 23 (1973) 450.
Fiorito et al., Appl. Phys. Letts. 23 (1973) 448.
Campisano et al., Solid St. Electronics, 21 (1978) 485.
Kachurin et al., Sov. Phys. Semicond. 9 (1976) 946.
Fan et al., Appl. Phys. Letts. 34 (Jun. 1979) 780.
Donnelly et al., Appl. Phys. Letts. 20 (1972) 279.
Martin, Nuclear Inst. & Methods, 72 (1969) 223.

*Primary Examiner*—L. Dewayne Rutledge
*Assistant Examiner*—Upendra Roy
*Attorney, Agent, or Firm*—Nathan Edelberg; Robert P. Gibson; Aubrey J. Dunn

[57] ABSTRACT

A semiconductor substrate is bombarded by ions of sufficient energy to penetrate the surface of the substrate to some average predetermined depth. The substrate is then scanned by a laser beam having a small diameter compared to the substrate thickness and having sufficient energy to heat the substrate to the predetermined depth. The heat allows surface damage on the substrate from the ion bombardment to heal, and allows the ions and substrate to form a compound to the predetermined depth with controllable redistribution. This compound is the photodetector of the method. The ions may be implanted through a mask to produce isolated detector regions, or the entire substrate surface may be bombarded, and those regions not desired for detector regions may be removed by a laser beam of sufficient energy to cause evaporation of a layer of the substrate. Exemplary substrate and ions are respectively cadmium telluride and mercury.

5 Claims, 5 Drawing Figures

STRIP MASK
LASER ANNEAL

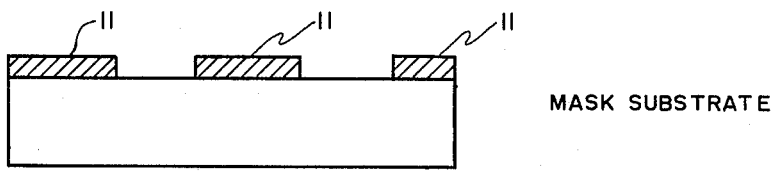
FIG. 1(a) — MASK SUBSTRATE
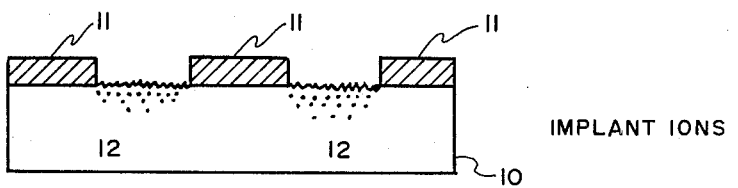
FIG. 1(b) — IMPLANT IONS
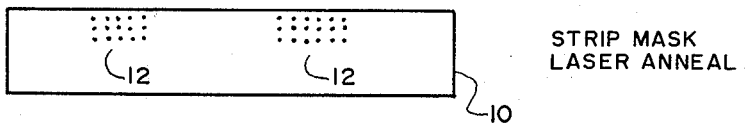
FIG. 1(c) — STRIP MASK LASER ANNEAL
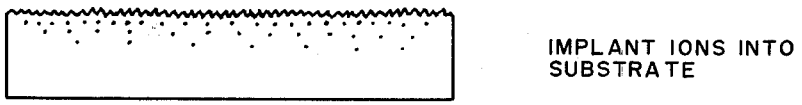
FIG. 2(a) — IMPLANT IONS INTO SUBSTRATE
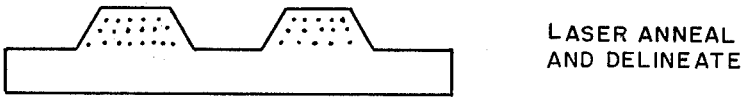
FIG. 2(b) — LASER ANNEAL AND DELINEATE

METHOD OF MAKING PHOTODETECTORS USING ION IMPLANTATION AND LASER ANNEALING

The invention described herein may be manufactured, used, and licensed by the U.S. Government for governmental purposes without the payment of any royalties thereon.

BACKGROUND OF THE INVENTION

This invention is in the field of focal-plane image detectors. Such detectors usually consist of a two-dimensional array of small conductor photodetectors and are made by two major methods. In the case of mercury cadmium telluride (HgCdTe) photodetectors, one method consists of bonding discrete photodetectors to a silicon substrate. The other major method consists of growing an epilayer of mercury cadmium telluride on a cadmium telluride substrate. The one method is difficult to perform with large, high-density arrays, and the other method requires steps to delineate individual detectors for crosstalk prevention. For detectors other than HgCdTe, similar methods, or other methods, may be used.

SUMMARY OF THE INVENTION

The invention is two major embodiments of a method for making a semiconductor focal plane image detector. Such a detector, when completed, includes a two-dimensional array of small photodetectors. In one embodiment the photodetectors are formed by implanting a pattern of high energy ions of a dopant into a substrate. Surface damage to the substrate from the ions is eliminated by annealing with a high-energy laser. The laser energy and wavelength are chosen such that only the ion implanted region in the substrate is heated appreciably, and not the deeper regions of the substrate. In an alternate embodiment, ions are implanted with or without a pattern into a substrate. A laser beam then evaporates the substrate to delineate individual photodetectors, and to anneal out ion damage. In both embodiments, the heat used for annealing ion damage also allows the implanted ions to combine with at least one element of the substrate to form a photodetecting compounds.

BRIEF DESCRIPTION OF THE DRAWINGS

FIG. 1 shows a partial flow chart of one embodiment of the invention.

FIG. 2 shows a partial flow chart for another embodiment of the invention.

DETAILED DESCRIPTION OF THE INVENTION

The methods of the invention are similar in that they each employ ion implantation of a reactant dopant into a semiconductor substrate and use laser heating for annealing of surface ion damage of the substrate and for forming a photodetecting compound of the implanted ions and the substrate. They are different in the manner by which they delineate individual photodetectors. In the embodiment for which FIG. 1 shows some steps, a semiconductor substrate 10, of a material such as cadmium telluride (CdTe) is bombarded through an ion-opaque mask 11 by either a flood or scanned pencil beam of mercury (Hg) ions. If a scanned beam is used, the beam may be amplitude modulated to implant ions only in desired regions and no mask will be necessary. In any event, one obtains a Gaussian distribution of Hg ions in thin regions near the surface of the CdTe. If a mask is used, one strips or otherwise removes the mask after implanting. A laser beam is then focussed into a small (with respect to desired photodetector lateral dimensions) beam and scanned over the surface of the CdTe to cause local heating. This heating melts the surface and the thin regions and induces both annealing of the surface and combination of the Hg with the CdTe to form the HgCdTe photodetectors. The usual signal or readout conductors may then be deposited on the substrate in the usual manner, such as by evaporating aluminum through a mask.

The method for which FIG. 2 shows some steps uses no mask for ion implantation but floods the entire CdTe substrate surface with ions. Those regions not desired as detectors may then be evaporated from the substrate by a high-power laser beam. The substrate may then be laser heated to anneal and combine as described above. Alternately, the entire surface may be laser heated to anneal and combine, then undesired portions may be evaporated by locally heating the surface. The evaporation and annealing-combining may be done with two different lasers, or a single laser may be varied in output power for the two operations. Moreover, evaporation and annealing-combining may be performed in a single scan of a laser beam, by varying the output power. This method may also use a mask on the substrate, with either a flood or pencil beam of ions. The same mask may be left in place while laser annealing-combining is performed, then stripped before the photodetectors are laser delineated. Whichever variation of this method is used, the final steps include depositing signal or readout conductors.

The mask, as mentioned in the methods above, may be deposited by the usual techniques, such as photolithography. Moreover, the laser beam(s) of the remainder of the methods may be used to expose such masks. These same laser beams may be used (at high power) to evaporate the mask(s) after use.

The materials for which this invention is useful comprise the IIIA-VA compounds (as taken from the periodic table of elements) such as GaAs in combination with other ions of the IIIA-VA class. The table below gives some of the possible combinations. A second class of compounds for which the invention is useful is the IIB-VIA compounds in combination with other ions of the IIB-VIA class. A typical example given in the table is CdTe(IIIB-VIA) with Hg bombardment to form $Hg_xCd_{1-x}Te$.

TABLE

| Ion | Substrate | Detector |
| --- | --- | --- |
| In | GaAs | $Ga_xIn_{1-x}$ |
| Ga | InAs | $Ga_xIn_{1-x}$ |
| Al | GaAsP | $Ga_xAl_{1-x}AsP$ |
| Al | GaAs | $Ga_xAl_{1-x}As$ |
| Ga | AlAs | $Ga_xAl_{1-x}As$ |
| Hg | CdTe | $Hg_xCd_{1-x}Te$ |

Although the invention has thus far been limited to a single ion bombardment and annealing, more than one of each may be done. Specifically, if one wishes to make diodes, one would bombard with ions of a different conductivity type in any one of the manners described above, but with less ion energy to give less penetration. Obviously, laser annealing-combining could also be done to a shallower depth than the initial annealing. For more complex devices than diodes, more steps of ion bombarding and annealing may be performed.

We claim:

1. A method of making at least one semiconductor photodetector including the steps of:
   preparing a binary compound semiconductor substrate;
   ion bombarding a side of said substrate in at least one predetermined area to implant ions to a predetermined depth; and
   locally laser heating at least said predetermined area to said predetermined depth, whereby ion bombardment damage is healed, and whereby the implanted ions combine with at least one element of said compound to form a photodetector compound.

2. The method as recited in claim 1 wherein an entire surface of said substrate is ion bombarded, and including an additional step of:
   locally laser heating said surface to evaporate said surface in a predetermined pattern to a predetermined depth.

3. Products as produced by the methods of either claim 1 or 2.

4. The method as set forth in either of claims 1 or 2 wherein the substrate is a compound of elements with at least one element taken from Group IIIA and at least one element taken from Group VA of the periodic table of elements, and the ion bombarding is performed with ions of an element chosen from the two said groups, but different from the elements of the substrate.

5. The methods as set forth in either of claims 1 or 2 wherein the substrate is a compound of elements with at least one element taken from Group IIB and at least one element taken from Group VIA of the periodic table of elements, and the ion bombarding is performed with ions of an element chosen from the two said groups, but different from the elements of the substrate.

* * * * *